United States Patent
Van Liere et al.

(10) Patent No.: US 12,253,584 B2
(45) Date of Patent: Mar. 18, 2025

(54) RADIO FREQUENCY RECEIVER SYSTEM

(71) Applicant: KONINKLIJKE PHILIPS N.V., Eindhoven (NL)

(72) Inventors: Filips Van Liere, Best (NL); Sotir Filipov Ouzounov, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 173 days.

(21) Appl. No.: 18/031,013

(22) PCT Filed: Sep. 26, 2021

(86) PCT No.: PCT/EP2021/076424
§ 371 (c)(1),
(2) Date: Apr. 10, 2023

(87) PCT Pub. No.: WO2022/078739
PCT Pub. Date: Apr. 21, 2022

(65) Prior Publication Data
US 2023/0375646 A1  Nov. 23, 2023

(30) Foreign Application Priority Data
Oct. 13, 2020 (EP) .................................... 20201432

(51) Int. Cl.
*G01R 33/36* (2006.01)
(52) U.S. Cl.
CPC ..... *G01R 33/3621* (2013.01); *G01R 33/3607* (2013.01)
(58) Field of Classification Search
CPC .................. G01R 33/3607; G01R 33/3621
See application file for complete search history.

(56) References Cited

U.S. PATENT DOCUMENTS

2002/0105449 A1   8/2002   Schreier et al.
2006/0071835 A1   4/2006   Inukai
(Continued)

FOREIGN PATENT DOCUMENTS

EP   3565124 A1    11/2019
WO   2009093172 A1  7/2009
WO   2014166983 A1  10/2014

OTHER PUBLICATIONS

Yu et al."Adaptive Quantisation for One-Bit Sigma-Delta Modulation" IEE Proceedings G. Electronic Circuits & Systems, vol. 139, No. 1 Feb. 1, 1992 p. 39-44.
(Continued)

*Primary Examiner* — Alesa Allgood

(57) ABSTRACT

For a radio frequency (RF) receiver system (1) for providing magnetic resonance (MR) information from an examination space of a MR imaging system, a solution for increasing the dynamic range of the radio frequency (RF) receiver system (1) for a better imaging performance shall be created. A sigma delta ADC of the RF receiver system operates in single-bit mode with an automatic gain control (AGC) circuit used to control the DAC feedback strength thereby extending the dynamic range of the receiver to match the MRI signal. The present invention also refers to a magnetic resonance (MR) imaging system, a method A method for extending the dynamic range of a radio frequency (RF) receiver system, a software package for a magnetic resonance (MR) imaging system, a software package for upgrading a magnetic resonance (MR) imaging system and a computer program product.

14 Claims, 5 Drawing Sheets

(56) References Cited

U.S. PATENT DOCUMENTS

2006/0092059 A1    5/2006  Guimaraes
2009/0033533 A1    2/2009  Pai et al.
2016/0054405 A1*  2/2016  Ouzounov ............. G01R 33/34
                                                        324/309

OTHER PUBLICATIONS

International Search Report From PCT/EP2021/076424 Mailed Dec. 23, 2021.

* cited by examiner

RADIO FREQUENCY RECEIVER SYSTEM

CROSS REFERENCE TO RELATED APPLICATIONS

This application is a U.S. national phase application of International Application No. PCT/EP2021/076424 filed on Sep. 26, 2021, which claims the benefit of EP application No. 20201432.0 filed Oct. 13, 2020 and is incorporated herein by reference.

FIELD OF THE INVENTION

The invention relates to the field of magnetic resonance (MR) imaging. In particular, the invention relates to a radio frequency (RF) receiver system for providing magnetic resonance (MR) information from an examination space of a MR imaging system. The invention further relates to a magnetic resonance (MR) imaging system, a method for providing for extending the dynamic range of a radio frequency (RF) receiver system of a magnetic resonance (MR) imaging system, a software package for a magnetic resonance (MR) imaging system and a software package for upgrading a magnetic resonance (MR) imaging system.

BACKGROUND OF THE INVENTION

The dynamic range of the MRI signal exceeds the dynamic range of commercially available ADCs. Various techniques have been developed to extend the dynamic range of the ADC through variable gain and/or compression in the signal conditioning prior to the ADC. For sigma delta ADCs, the traditional approach is to increase dynamic range by means of a multi-bit feedback DAC or higher order loop filter.

A multi-bit feedback DAC requires a corresponding multi-bit quantizer. This increases the complexity of the ADC as well as the total power consumption of the receiver. Since any error in the feedback DAC cannot be compensated by the sigma delta control loop, the multi-bit DAC must also be highly linear in order not to compromise the required high dynamic range and fidelity of the sampled signal. Single-bit sigma delta ADCs are inherently linear avoiding the implementation complexities associated with realizing a sufficiently linear multi-bit feedback DAC. Increasing the loop filter order is also costly in terms of power consumption and chip area and also complicates further the design. Typically, the theoretical benefit of higher order loop filters can only be partially achieved due to the high design complexity and sensitivity to errors.

The European patent application EP 3 565 124 discloses an analogue-to-digital converter based on a single bit sigma-delta quantiser. This known analogue-to-digital converter comprises an auto-ranging function implemented in a range control circuit.

SUMMARY OF THE INVENTION

It is an object of the invention to provide a radio frequency (RF) receiver system with an increased dynamic range.

According to the invention, this object is addressed by the subject matter of the independent claims. Preferred embodiments of the invention are described in the sub claims.

Therefore, according to the invention, a frequency (RF) receiver system for providing magnetic resonance (MR) information from an examination space of a MR imaging system is provided, the RF receiver system comprising: at least one RF coil with at least one connection port for receiving an analog MR information signal, at least one analog to digital converter (ADC), which is connected to the at least one connection port and which converts the analog MR information signal into a digital MR information signal, whereby the at least one ADC is a single-bit sigma delta ADC, the single-bit sigma delta ADC comprising a loop filter, a quantizer unit for quantizing the analog MR information signal and a variable output strength feedback digital to analog converter (DAC) unit, the RF receiver system further comprising a signal processing chain, the signal processing chain comprising a first digital down convertor, the first DDC being arranged to convert the digital MR information signal at an ADC sampling frequency to an intermediate sampling frequency, at least one automatic gain control circuit, wherein the AGC circuit is arranged after the first DDC and configured to operate at the intermediate sampling frequency, to track the temporal magnitude of the MRI signal and to adjust the digital to analog converter (DAC) unit's gain (inside the ADC) accordingly, at least one feedback control, the feedback control being configured to operate at the intermediate sampling frequency and for adjusting a DAC output strength as a function of the temporal magnitude of the MRI signal.

At any specific feedback DAC output strength, the single-bit ADC provides an inherently linear digitization of the MRI signal. The intermediate sampling frequency must be high enough to be able to track the variations of the signal magnitude and control the output strength of the feedback to avoid overflow in the sigma delta control loop. It is preferably as low as possible to minimize DDC power consumption. Further, the intermediate frequency is coupled to the concrete MR imaging mode that determines the intervals at which the MR signal strength is increasing to levels that can cause ADC overload.

In an embodiment of the invention the signal processing chain further comprising a numerical controlled oscillator (NCO) for providing a RF carrier frequency and a first multiplier for frequency shifting the quantized signal to the baseband sampling frequency ($F_{baseband}$).

In another embodiment of the invention the signal processing chain further comprising at least a second DDC (DDC2), the second DDC (DDC2) being configured to convert the signal at an intermediate sampling frequency ($F_{AGC}$) to a baseband sampling frequency ($F_{Baseband}$).

In a further embodiment of the invention the signal processing chain comprising a second multiplier arranged after the quantizer unit, wherein the second multiplier is configured to multiply the digital MR information signal with a digital representation of the DAC gain to adjust the digital signal to compensate for the current DAC gain.

In another embodiment of the invention the DAC is a two-level DAC with a high gain and a low gain, the signal processing chain further comprising a calibration unit, wherein the calibration unit is arranged after the quantizer unit, wherein the calibration unit is configured to adjust the digital MR information signal according to the relative gain between a high state and a low state of the AGC.

In a still further embodiment of the invention the AGC is configured to when the signal magnitude is larger than a high threshold the DAC transitions to the high state and when the signal magnitude is less than a low threshold the DAC transitions to the low state.

In an embodiment of the invention the first DDC comprises a high DDC and a low DDC wherein the high DDC and the low DDC are arranged within the section of the signal processing chain with the intermediate sampling frequency and being configured to down convert the high state signal and the low state signal of the AGC, the signal processing chain further comprising a summator for combining the high state signal and the low state signal only after relative gain adjustment, the single-bit sigma delta ADC further comprising a multiplier before the high DDC and respectively before the low DDC for frequency shifting the quantized signal to the baseband sampling frequency by the numerical controlled oscillator.

In another aspect of the invention, the object is achieved by a magnetic resonance (MR) imaging system, comprising a main magnet for generating a static magnetic field, a magnetic gradient coil system for generating gradient magnetic fields superimposed to the static magnetic field, an examination space provided to position a subject of interest within, at least one radio frequency receiver system as claimed in claims 1 to 3 for providing magnetic resonance information from the examination space, and a digital signal processing unit for processing of a digital MR information signal provided by the at least one RF receiver system.

In another aspect of the invention, the object is achieved by a method for extending the dynamic range of a radio frequency (RF) receiver system, the method comprising the following steps:

providing a RF receiver system as described above,
receiving an analog MR information signal at the at least one connection port of the at least one RF coil within the RF receiver system,
performing an analog to digital conversion of the analog MR information signal into a digital MR information signal in the RF receiver system,
converting the digital MR information signal at an ADC sampling frequency to an intermediate sampling frequency by a first digital down convertor,
tracking the magnitude of the digital MR information signal with the automatic gain control circuit,
adjusting the DAC gain regarding the magnitude of the digital MR information signal,
frequency shifting the digital MR information signal to a baseband sampling frequency by a numerical controlled oscillator for providing a RF carrier frequency and a digital mixer,
converting the signal at an intermediate sampling frequency to a baseband sampling frequency by the second DDC.

In an embodiment of the invention the method further comprises the following step:

multiplying the digital MR information signal with a digital representation of the DAC gain.

In another embodiment of the invention the method further comprises the steps of:

providing a two-level DAC with a high gain and a low gain,
providing a calibration circuit after the quantizer unit,
adjusting the digital MR information signal to the relative gain between a high gain state and a low gain state of the AGC by the calibration circuit.

In a still further embodiment of the invention the method further comprises the steps of:

providing a two-level DAC with a high gain and a low gain,
providing a high DDC and a low DDC wherein the high DDC and the low DDC are arranged within the section of the single-bit sigma delta ADC with the intermediate sampling frequency,
shifting the digital MR information signal to the baseband sampling frequency by the numerical controlled oscillator before the high DDC and respectively before the low DDC by a multiplier,
converting down a high state signal and a low state signal of the AGC by the high DDC and the low DDC,
combining the converted high state signal and low state signal after relative gain adjustment by a summator.

In another aspect of the invention, the object is achieved by a software package for a magnetic resonance (MR) imaging system, whereby the software package contains instructions for controlling a radio frequency (RF) receiver system according to the method described above.

In another aspect of the invention, the object is achieved by a software package for upgrading a magnetic resonance (MR) imaging system, whereby the software package contains instructions for controlling a radio frequency (RF) receiver system according to the method described above.

In a still further aspect of the invention, the object is achieved by a computer program product comprising instructions which, when the program is executed by a computer, cause the computer to carry out the steps of the method as described above. That is, the computer programme (product) of the invention comprises instructions which, when the programme is executed by a computer, cause the computer to carry out (the steps of) the method of the invention.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
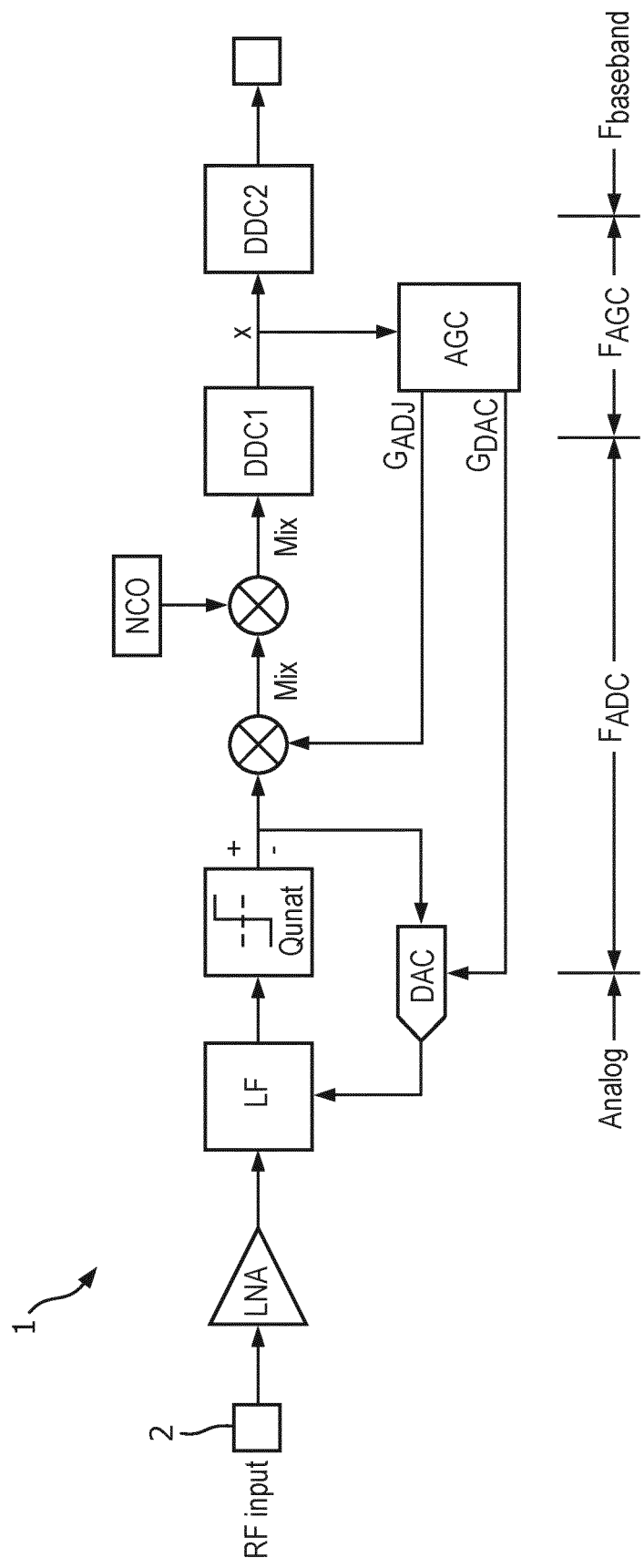
FIG. 1 schematically depicts a block diagram of a radio frequency (RF) receiver system in accordance with an embodiment of the invention, FIG. 2 schematically depicts a block diagram of a radio frequency (RF) receiver system with a two-level (high-low) DAC in accordance with another embodiment of the invention, FIG. 3 schematically depicts a diagram of the threshold value, FIG. 4 schematically depicts a block diagram of a radio frequency (RF) receiver system with a two-level (high-low) DAC with a high-low calibration performed at the intermediate signal frequency, in accordance with another embodiment of the invention.

FIG. 1 schematically depicts a block diagram of a radio frequency (RF) receiver system in accordance with an embodiment of the invention. The RF receiver system 1 comprises at least one RF coil with at least one connection port 2 for receiving an analog MR information signal. The RF receiver system 1 further comprises a low noise amplifier LNA for amplifying the analog MR information signal. The amplified MR information signal is propagated to an analog to digital converter ADC. The ADC in this embodiment is a RF single-bit sigma-delta analog to digital converter with a variable output strength feedback DAC. The loop filter LF, the quantizer unit QUANT and digital to analog convertor DAC form the sigma delta ADC control loop. The output strength of the DAC must be sufficient (i.e. larger than the maximum input) to compensate for all signal levels at the LNA output during each period of the ADC clock $F_{ADC}$. A high output strength (or gain) of the DAC allows a high signal magnitude to be tracked. A low DAC gain results in low quantization noise and respectively high resolution for small signals. DAC gain therefore provides the possibility to shift the operational range of the ADC with respect to input signal strength, ideally keeping all other parameters (e.g. quantization and thermal noise) the same. It should be noted, however, that for high input signals, when the DAC gain is also made high numerous non-linear effects start to appear, due to the increased signal levels internal to the SDM that lead to degradation of the SNDR. Further, for any DAC gain settings, for high input signal non-linearities appear in the ADC operation that are also observed as a decrease of the SNDR. In this line a well-timed switching between low and high DAC gain is essential for proper operation. By increasing DAC gain only during periods of high signal magnitude the DR is extended only when needed and the corresponding decrease in SNDR is minimized. This is particularly advantageous for MRI echo signals that are only high for a limited duration, limiting a decrease in SNDR. In practice, this decrease in SNDR is marginal.

The automatic gain control AGC circuit in FIG. 1 tracks the magnitude of the detected signal and adjusts the DAC gain $G_{DAC}$ accordingly. Simultaneously, a digital representation of the DAC gain $G_{ADJ}$ is used to adjust the digital signal to compensate for the current DAC gain. The compensation is performed by multiplying the digital signal with $G_{ADJ}$.

The remainder of the circuit comprises the ranging receiver. The quantized signal is frequency shifted to baseband with a digital mixer MIX. The required RF carrier frequency is generated by a numerically controlled oscillator NCO. Subsequently, the baseband signal is low-pas filtered and decimated to baseband by a digital down convertor DDC. This mechanism provides for sufficiently fast and accurate determination of the switching point and for automatic calibration (equalization) of the digital data such that a uniform bitstream representing the complete dynamic range can be reconstructed.

It is advantageous to operate the AGC at an intermediate frequency $F_{AGC}$. To this end, the DDC is split in two parts DDC1, DDC2. DDC1 converts the signal at $F_{ADC}$ to the intermediate sampling frequency $F_{AGC}$ at which the AGC operates. DDC2 then further converts the signal to the baseband sampling frequency $F_{BASEBAND}$.

Figure 2:
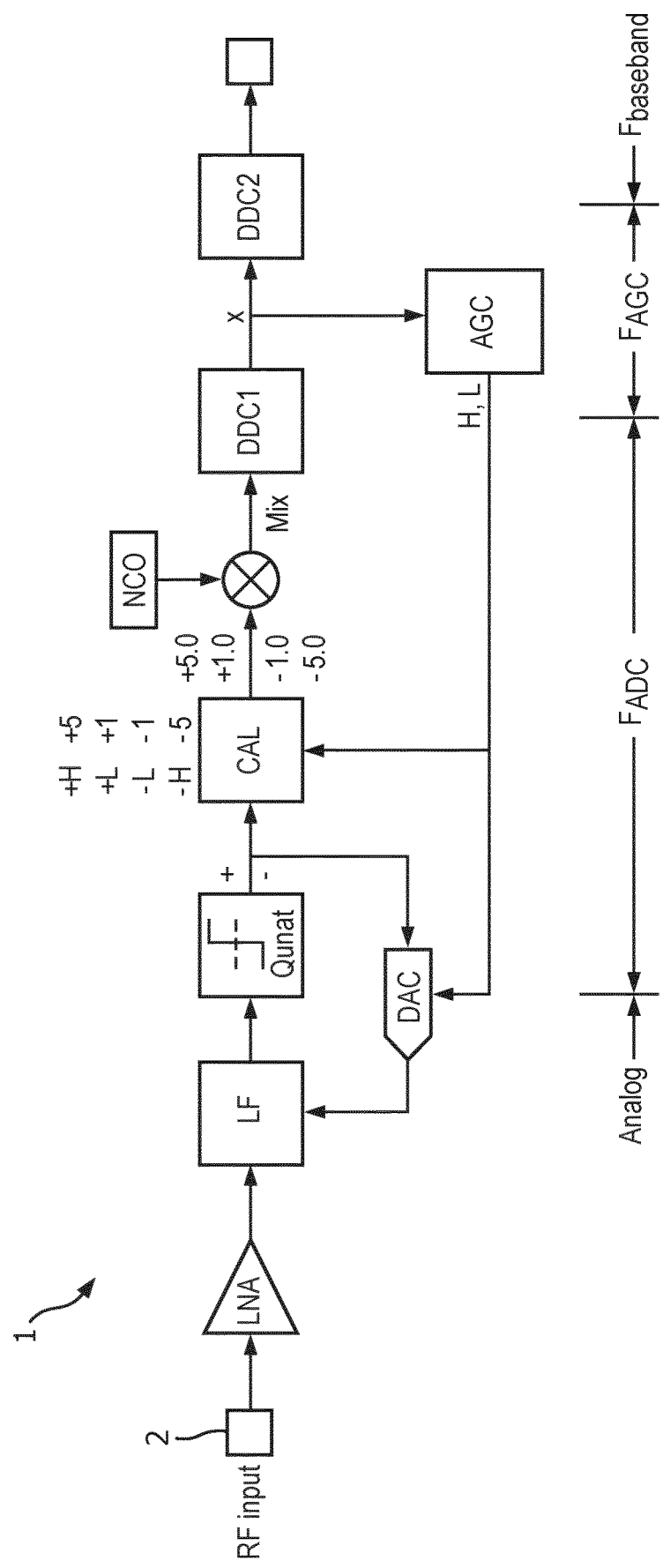

FIG. 2 schematically depicts a block diagram of a radio frequency (RF) receiver system with a two-level (high-low) DAC in accordance with another embodiment of the invention. In this embodiment, the DAC is a two-level DAC with a high gain H and a low gain L. A calibration circuit CAL adjusts the sampled signal according to the relative gain between the H and L states of the DAC. CAL consists of a signed digital value that replaces the single-bit value output by QUANT when in the H state. For example, a DAC that has a nominal gain of 1.0 in the L state and a nominal gain of 5.0 in the H state may in practice have a relative gain of 4.9963. CAL consequently generates the following values as function of the gain state and QUANT output:

| State | QUANT | CAL |
| --- | --- | --- |
| L | −1 | −1.0000 |
| L | +1 | +1.0000 |
| H | −1 | −4.9863 |
| H | +1 | +4.9863 |

A calibration procedure may be required to accurately determine relative DAC gain. Alternatively, the DAC may be calibrated during production, for example, through laser trimming of a resistor. Since the calibrated relative gain value must have sufficient accuracy to span the entire dynamic range of the input signal, it necessarily requires a large number of bits. For example, an MRI signal typically has a dynamic range of ~90 dB and as a result, at least (~90/6.02)=~15 bits are required to accurately represent relative DAC gain. This results in a significant increase in DDC power consumption.

Figure 3:
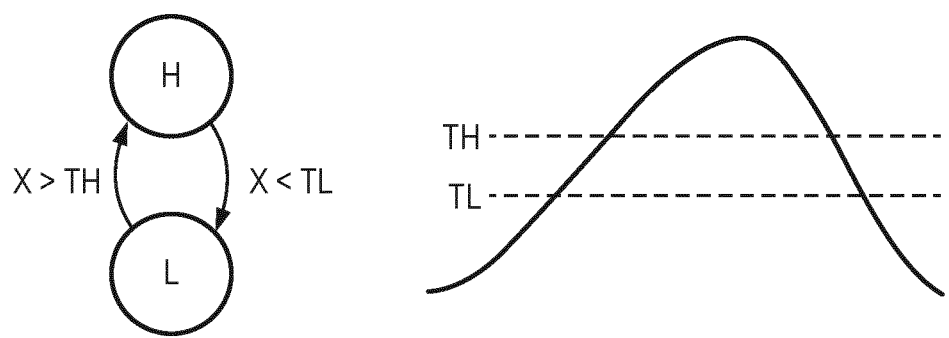

FIG. 3 schematically depicts a diagram of the threshold value TH and TL. To avoid excessive transitions between H an L states, the AGC may be implemented with hysteresis. This requires a high threshold value TH and a low threshold value TL. When the signal magnitude is larger than the high threshold (X>TH) the DAC transitions to the H state. When the signal magnitude is less than the low threshold (X<TL) the DAC transitions to the L state.

Figure 4:
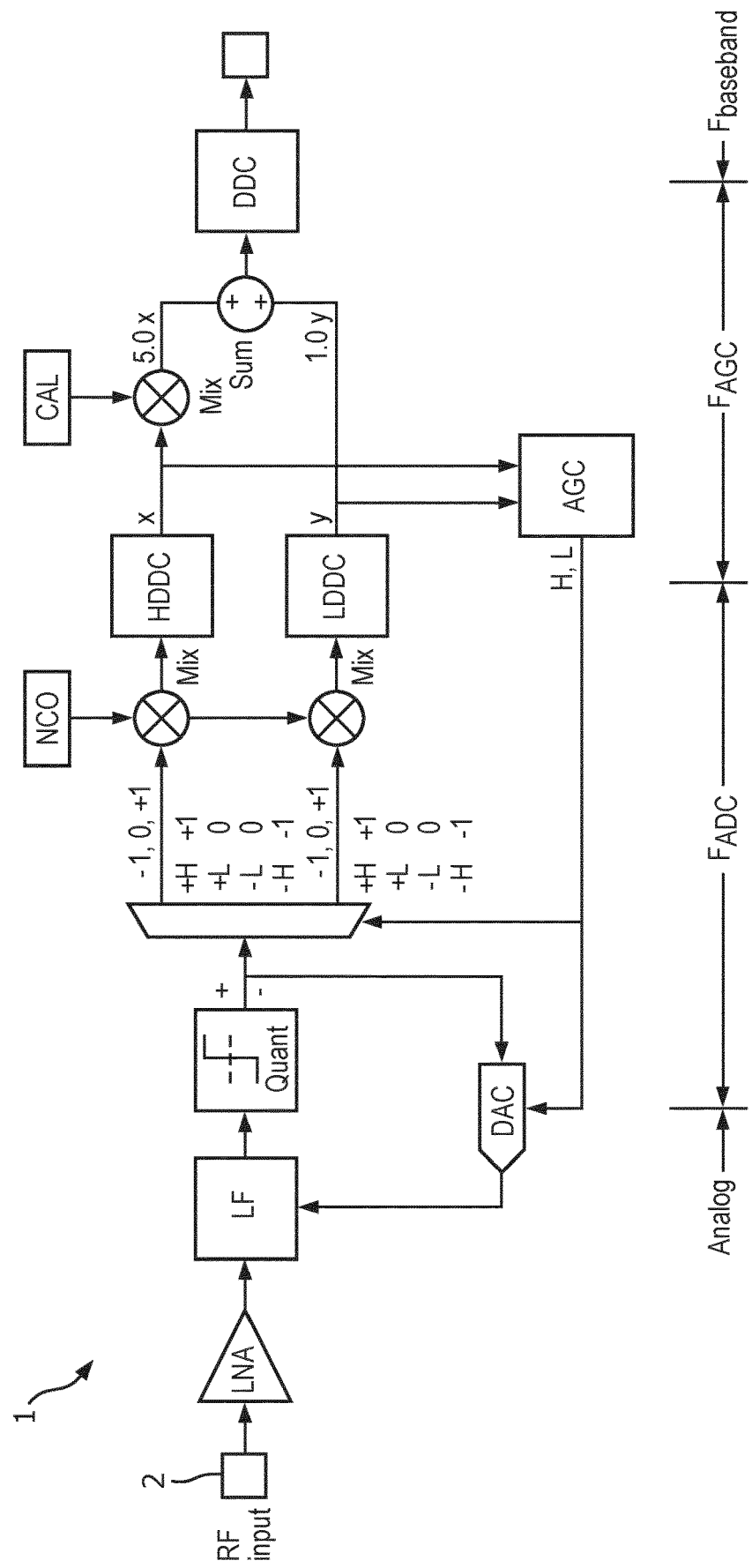

FIG. 4 schematically depicts a block diagram of a radio frequency (RF) receiver system with a two-level (high-low) DAC with a high-low calibration performed at the intermediate signal bandwidth, in accordance with another embodiment of the invention. DDC power consumption is proportional to both the number of bits required to represent the signal and the sampling frequency at which it operates. $G_{ADJ}$ necessarily requires numerous bits to compensate the analogue $G_{DAC}$ to sufficient accuracy. This increases the DDC consumption power required to down convert to baseband. By first converting the (unadjusted) signal to a lower intermediate sampling frequency, bit count at high sampling frequencies is reduced. FAGC thus provides a trade off between the maximum signal bandwidth that can be tracked by the AGC and the power consumption of the DDC.

Since the unadjusted signal is down converted to $F_{AGC}$, it is necessary to down convert the H and L states signals concurrently, combining the two only after relative gain adjustment. This is performed by the high DDC HDDC and low DDC LDDC signal paths. The signal paths are summed by a summator SUM after calibration. Calibration now requires a multiplication MIX in the digital domain as the down converted signal has become a multi-bit signal due to the digital processing before multiplication/mixing.

Figure 5:
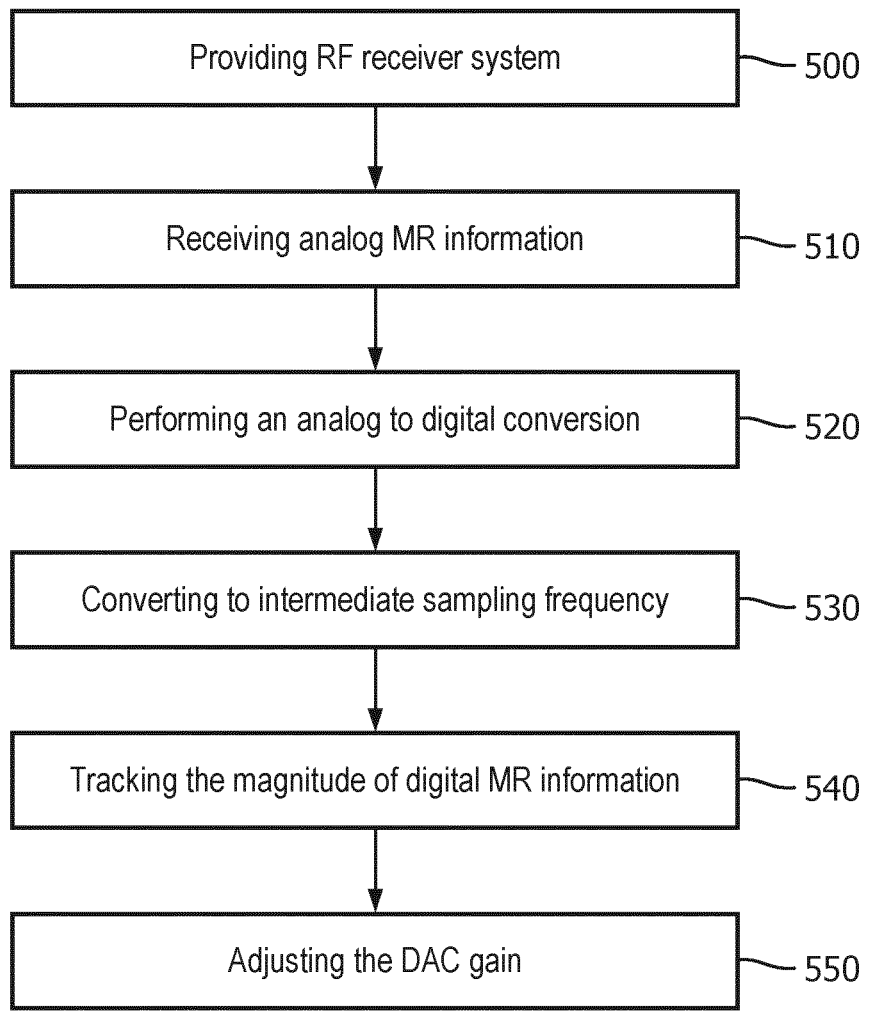
FIG. 5 shows a flowchart of a method for extending the dynamic range of an ADC of a radio frequency (RF) receiver system in accordance with an embodiment of the invention.

FIG. 5 shows a flowchart of a method for extending the dynamic range of an ADC of a radio frequency (RF) receiver system in accordance with an embodiment of the invention. The method starts with step 500, in which a providing a radio frequency (RF) receiver system according to claim 1 is provided.

Then in step 510 an analog MR information signal is received at the at least one connection port of the at least one RF coil within the RF receiver system.

Afterwards in step 520 an analog to digital conversion of the analog MR information signal into a digital MR information signal is performed in the RF receiver system.

The digital MR information signal at an ADC sampling frequency $F_{ADC}$ is converted to an intermediate sampling frequency $F_{AGC}$ by a first digital down convertor DDC1 in step 530.

The magnitude of the digital MR information signal is tracked with the automatic gain control AGC circuit in step 540.

Afterwards the DAC gain $G_{DAC}$ is adjusted regarding the magnitude of the digital MR information signal in step 550.

In an embodiment of the invention the digital MR information signal is frequency shifted to a baseband sampling frequency $F_{Baseband}$ by a numerical controlled oscillator NCO for providing a RF carrier frequency and a digital mixer MIX. Furthermore, it may be provided in an execution example of the invention that the signal at an intermediate sampling frequency $F_{AGC}$ is converted to a baseband sampling frequency $F_{Baseband}$ by the second DDC DDC2.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

Radio frequency (RF) receiver system 1
Connection port 2
Low-noise amplifier LNA
Loop filter LF
Quantizer unit QUANT
Digital to analog converter DAC
Sigma delta modulator SDM
Analog to digital converter ADC
ADC Clock $F_{ADC}$
Intermediate sampling frequency $F_{AGC}$
Baseband sampling frequency $F_{Baseband}$
Automatic gain control AGC
Digital down converter DDC
Numerically controlled oscillator NCO
First digital down converter DDC1
Second digital down converter DDC2
Low state L
High state H
DAC Gain $G_{DAC}$
Digital representation of DAC gain $G_{ADJ}$
Calibration circuit CAL
Low digital down converter LDDC
High digital down converter HDDC
Low threshold TL
High threshold TH
Summator SUM
Mixer MIX

The invention claimed is:

1. A radio frequency (RF) receiver system for providing magnetic resonance (MR) information from an examination space of a MR imaging system, comprising:
at least one RF coil with at least one connection port for receiving an analog MR information signal,
at least one analog to digital converter (ADC), which is connected to the at least one connection port and which converts the analog MR information signal into a digital MR information signal, whereby the at least one ADC is a single-bit sigma delta ADC, the single-bit sigma delta ADC comprising a loop filter (LF), a quantizer unit (QUANT) for quantizing the analog MR information signal and a variable output strength feedback digital to analog converter (DAC) unit,
the RF receiver system further comprising a signal processing chain, the signal processing chain comprising a first digital down convertor (DDC1), the first DDC being arranged to convert the digital MR information signal at an ADC sampling frequency ($F_{ADC}$) to an intermediate sampling frequency ($F_{AGC}$), and at least a second DDC (DDC2), the second DDC (DDC2) being configured to convert the signal at the intermediate sampling frequency ($F_{AGC}$) to a baseband sampling frequency ($F_{Baseband}$),
at least one automatic gain control (AGC) circuit, wherein the AGC circuit is arranged after the first DDC (DDC1) and configured to operate at the intermediate sampling frequency ($F_{AGC}$), to track the temporal magnitude of the MRI signal and to adjust the digital to analog converter (DAC) unit's gain ($G_{DAC}$) accordingly,
at least one feedback control, the feedback control being configured to operate at the intermediate sampling frequency ($F_{AGC}$) and for adjusting a DAC output strength as a function of the temporal magnitude of the MRI signal.

2. The radio frequency (RF) receiver system according to claim 1, wherein the signal processing chain further comprising:
a numerical controlled oscillator (NCO) for providing a RF carrier frequency and a
first multiplier for frequency shifting the quantized signal to the baseband sampling frequency ($F_{Baseband}$).

3. The radio frequency (RF) receiver system according to claim 1, the signal processing chain further comprising:
a second multiplier arranged after the quantizer unit (QUANT), wherein the second multiplier is configured to multiply the digital MR information signal with a digital representation of the DAC gain ($G_{ADJ}$) to adjust the digital signal to compensate for the current DAC gain.

4. The radio frequency (RF) receiver system according to claim 1, wherein
the DAC is a two-level DAC with a high gain (H) and a low gain (L),
the signal processing chain further comprising a calibration unit (CAL), wherein the calibration unit is arranged after the quantizer unit (QUANT), wherein the calibration unit is configured to adjust the digital MR information signal according to the relative gain between a high state and a low state of the AGC.

5. The radio frequency (RF) receiver system according to claim 1, wherein
the AGC is configured to when the signal magnitude is larger than a high threshold (TH) the DAC transitions to the high state and when the signal magnitude is less than a low threshold (TL) the DAC transitions to the low state.

6. The radio frequency (RF) receiver system according to claim 5, wherein
the first DDC (DDC1) comprises a high DDC (HDDC) and a low DDC (LDDC) wherein the high DDC and the low DDC are arranged within the section of the signal processing chain with the intermediate sampling frequency ($F_{AGC}$) and being configured to down convert the high state signal and the low state signal of the AGC, the single-bit sigma delta ADC further comprising a summator for combining the high state signal and the low state signal only after relative gain adjustment, the signal processing chain further comprising a multiplier before the high DDC and respectively before the low DDC for frequency shifting the quantized signal to the baseband sampling frequency ($F_{Baseband}$) by the numerical controlled oscillator (NCO).

7. A magnetic resonance (MR) imaging system, comprising a main magnet for generating a static magnetic field, a magnetic gradient coil system for generating gradient magnetic fields superimposed to the static magnetic field, an examination space provided to position a subject of interest within, at least one radio frequency receiver system as according to claim 1 configured to provide magnetic resonance information from the examination space, and a digital signal processing unit configured to process digital MR information signal provided by the at least one RF receiver system.

8. A method for extending the dynamic range of a radio frequency (RF) receiver system, the method comprising the following steps:

providing a radio frequency (RF) receiver system according to claim 1, receiving an analog MR information signal at the at least one connection port of the at least one RF coil within the RF receiver system, performing an analog to digital conversion of the analog MR information signal into a digital MR information signal in the RF receiver system, converting the digital MR information signal at an ADC sampling frequency ($F_{ADC}$) to an intermediate sampling frequency ($F_{AGC}$) by a first digital down converter (DDC1), tracking the magnitude of the digital MR information signal with the automatic gain control (AGC) circuit, adjusting the digital to analog converter (DAC) unit's gain ($G_{DAC}$) regarding the magnitude of the digital MR information signal, frequency shifting the digital MR information signal to a baseband sampling frequency ($F_{Baseband}$) by a numerical controlled oscillator (NCO) for providing a RF carrier frequency and a digital mixer (MIX), converting the signal at an intermediate sampling frequency ($F_{AGC}$) to a baseband sampling frequency ($F_{Baseband}$) by the second DDC (DDC2).

9. The method according to claim 8, further comprising:

multiplying the digital MR information signal with a digital representation of the DAC gain ($G_{ADJ}$).

10. The method according to claim 8, further comprising:

providing a two-level DAC with a high gain (H) and a low gain (L), providing a calibration circuit (CAL) after the quantizer unit (QUANT), adjusting the digital MR information signal to the relative gain between a high gain state and a low gain state of the AGC by the calibration circuit (CAL).

11. The method according to claim 8, further comprising the steps of:

providing a two-level DAC with a high gain (H) and a low gain (L), providing a high DDC (HDDC) and a low DDC (LDDC) wherein the high DDC and the low DDC are arranged within the section of the single-bit sigma delta ADC with the intermediate sampling frequency ($F_{AGC}$), shifting the digital MR information signal to the baseband sampling frequency ($F_{Baseband}$) by the numerical controlled oscillator (NCO) before the high DDC and respectively before the low DDC by a multiplier, converting down a high state signal and a low state signal of the AGC by the high DDC (HDDC) and the low DDC (LDDC), combining the converted high state signal and low state signal after relative gain adjustment by a summator.

12. A software package for a magnetic resonance (MR) imaging system, whereby the software package contains instructions stored on a non-transitory computer readable medium that is configured to control a radio frequency (RF) receiver system according to the method claim 8.

13. A software package for upgrading a magnetic resonance (MR) imaging system, whereby the software package contains instructions stored on a non-transitory computer readable medium that is configured to control a radio frequency (RF) receiver system according to the method claim 8.

14. A computer program product comprising instructions stored on a non-transitory computer readable medium such that when the program is executed by a computer, causes the computer to carry out the the method of claim 8.

* * * * *